US008932948B2

(12) United States Patent
Sel et al.

(10) Patent No.: US 8,932,948 B2
(45) Date of Patent: Jan. 13, 2015

(54) MEMORY CELL FLOATING GATE REPLACEMENT

(71) Applicant: SanDisk Technologies Inc., Plano, TX (US)

(72) Inventors: Jongsun Sel, Los Gatos, CA (US); Tuan Pham, San Jose, CA (US); Ming Tian, Yokkaichishi (JP)

(73) Assignee: SanDisk Technologies, Inc., Plano, TX (US)

( * ) Notice: Subject to any disclaimer, the term of this patent is extended or adjusted under 35 U.S.C. 154(b) by 22 days.

(21) Appl. No.: 13/865,865

(22) Filed: Apr. 18, 2013

(65) Prior Publication Data

US 2014/0312403 A1  Oct. 23, 2014

(51) Int. Cl.
| | |
|---|---|
| H01L 21/28 | (2006.01) |
| H01L 27/115 | (2006.01) |
| H01L 29/788 | (2006.01) |
| H01L 29/66 | (2006.01) |

(52) U.S. Cl.
CPC ........ *H01L 29/788* (2013.01); *H01L 29/66825* (2013.01); *H01L 27/11524* (2013.01); *H01L 27/11541* (2013.01)
USPC ............................ 438/593; 438/257; 438/258

(58) Field of Classification Search
CPC ................... H01L 27/11517; H01L 27/11524; H01L 27/11526; H01L 27/11541; H01L 29/788; H01L 29/66825
USPC ......... 438/183, 257, 258, 261, 587, 588, 592, 438/593
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,887,145 A | 3/1999 | Harari et al. | |
| 6,046,935 A | 4/2000 | Takeuchi et al. | |
| 7,951,669 B2 | 5/2011 | Harari et al. | |
| 8,194,470 B2 | 6/2012 | Higashitani | |
| 2005/0079671 A1 | 4/2005 | Chen et al. | |
| 2009/0140317 A1 | 6/2009 | Rosmeulen | |
| 2009/0256211 A1* | 10/2009 | Booth et al. | 257/407 |
| 2011/0122698 A1 | 5/2011 | Izumida et al. | |
| 2012/0025295 A1* | 2/2012 | Sakagami | 257/316 |
| 2012/0187468 A1* | 7/2012 | Liang et al. | 257/319 |
| 2012/0228691 A1* | 9/2012 | Dunga et al. | 257/315 |

FOREIGN PATENT DOCUMENTS

JP   2008-258286   10/2008

OTHER PUBLICATIONS

Notification of Transmittal of the International Search Report and the Written Opinion of the International Searching Authority, or the Declaration for Int'l Application No. PCT/US2014/032661 mailed Jul. 24, 2014, 13 pages.

* cited by examiner

*Primary Examiner* — Tom Thomas
*Assistant Examiner* — John Bodnar
(74) *Attorney, Agent, or Firm* — Davis Wright Tremaine LLP (57) ABSTRACT

A NAND flash memory chip is formed by depositing two N-type polysilicon layers. The upper N-type polysilicon layer is then replaced with P-type polysilicon and barrier layer in the array area only, while maintaining the upper N-type polysilicon layer in the periphery. In this way, floating gates are substantially P-type while gates of peripheral transistors are N-type.

13 Claims, 6 Drawing Sheets

FIG._ 2B (PRIOR ART)
(Section A-A)

MEMORY CELL FLOATING GATE REPLACEMENT

BACKGROUND OF THE INVENTION

This invention relates generally to non-volatile semiconductor memories of the flash EEPROM (Electrically Erasable and Programmable Read Only Memory) type, their formation, structure and use, and specifically to methods of making NAND memory cell arrays and associated peripheral circuits.

Figure 1:
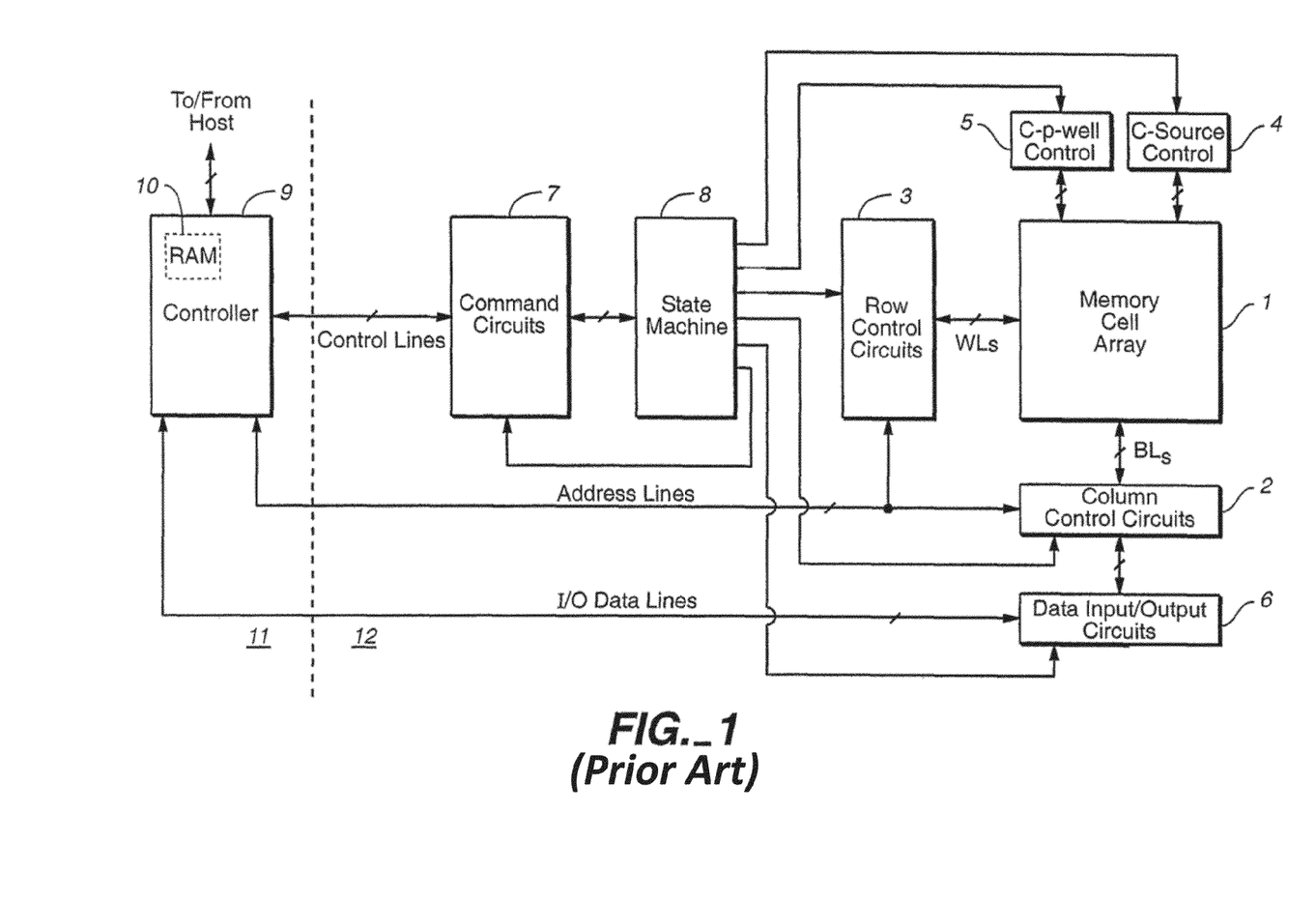
FIG. 1 is a block diagram of a prior art memory system.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

Figure 2A:
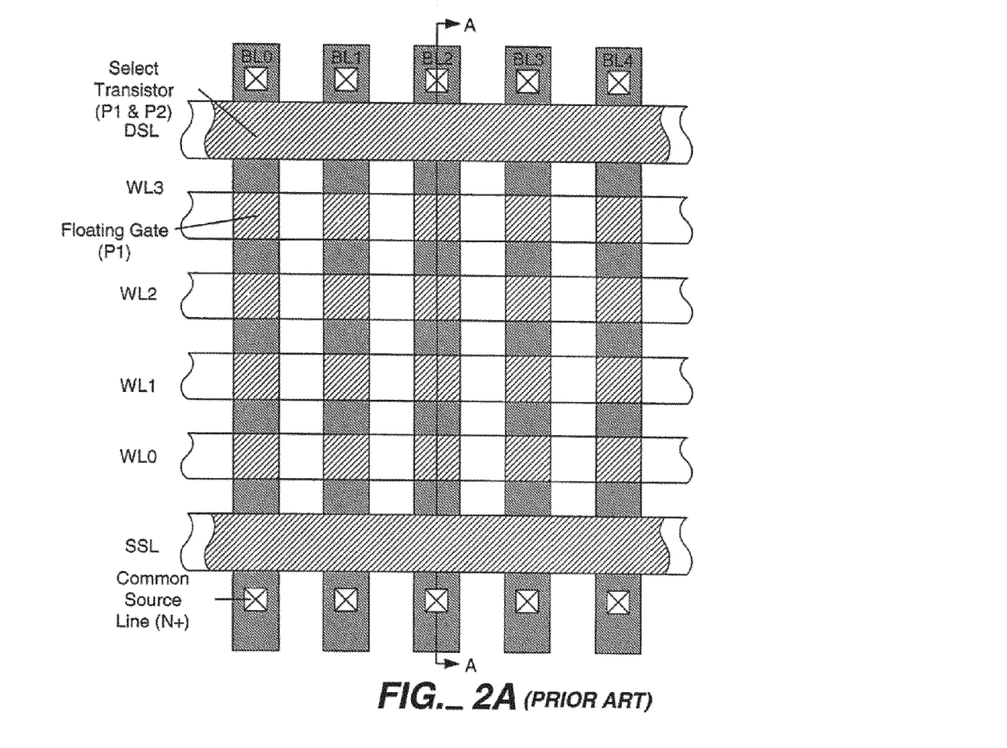
FIG. 2A is a plan view of a prior art NAND array.
Figure 2B:
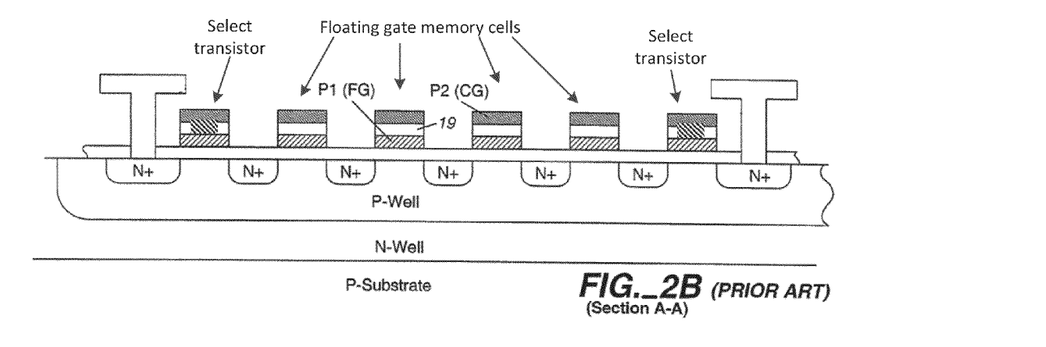
FIG. 2B is a cross-sectional view of the prior art NAND array of FIG. 2A taken along the line A-A.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Peripheral circuits are formed on the same chip as the memory cells but they have very different functions that require different device structures. Thus, a process that is suitable for forming a memory array may not be suitable for forming peripheral circuits and vice versa. While it may be possible to mask the memory array to perform process steps that affect only peripheral circuits and mask peripheral circuits to perform process steps that affect only the memory array, this increases the number of process steps to manufacture a memory chip. In general, the cost of manufacturing a memory chip increases with the number of processing steps used, and the number of defective units tends to increase also. So it is desirable to use the same process steps for the memory array and peripheral circuits.

Thus, there is a need for a memory chip manufacturing process that forms the memory cells and peripheral circuits in an efficient manner and there is a need for structures that can be formed accordingly.

SUMMARY OF THE INVENTION

When manufacturing NAND flash memory chips, P-type polysilicon used as a floating gate material, may provide better data retention than N-type polysilicon. However, it may be desirable to have N-type polysilicon gates in peripheral transistors. A method of making NAND flash memory chips includes depositing two N-type polysilicon layers, separated by a thin low-resistance dielectric layer, to form peripheral transistors. The uppermost of these two polysilicon layers is removed from the array area only (not the peripheral area) using the dielectric layer as an etch stop. The removed polysilicon layer is then replaced with a P-type polysilicon layer and a barrier layer to contain the P-type dopant (e.g. Boron).

An example of a method of forming a NAND flash memory integrated circuit includes: forming a first polysilicon layer overlying a gate dielectric layer; forming a first dielectric layer overlying the first polysilicon layer; forming a second polysilicon layer overlying the first dielectric layer; removing the second polysilicon layer in an array area using the first dielectric layer as an etch stop, while maintaining the second polysilicon layer in a peripheral area; depositing a second dielectric layer and a third polysilicon layer to replace the second polysilicon layer in the array area; forming a floating gate in the array area from a portion of the first polysilicon layer and a portion of the third polysilicon layer connected through a portion of the second dielectric layer; and forming a transistor gate in the peripheral area from a portion of the first polysilicon layer and a portion of the second polysilicon layer connected through a portion of the first dielectric layer.

The first polysilicon layer and the second polysilicon layer may be of a first type and the third polysilicon layer may be of a second type. The first type may be N-type and the second type may be P-type. The third polysilicon layer may be in-situ doped with Boron and the second dielectric layer may form a barrier to Boron diffusion. The second dielectric layer may be formed of Silicon Nitride. The first dielectric layer may be removed along with the second polysilicon layer in the array area prior to depositing the second dielectric layer and the third polysilicon layer. The first dielectric layer may be maintained in the array area when the second polysilicon layer is removed, and the second dielectric layer may be deposited directly on the first dielectric layer in the array area. The first dielectric layer may be Silicon dioxide. The first dielectric layer may have a thickness that is sufficiently small that the first polysilicon layer and the second polysilicon layer are substantially electrically connected.

An example of a method of forming a NAND flash memory integrated circuit includes: forming a gate dielectric layer on a surface of a substrate; forming a first in-situ doped N-type polysilicon layer on the gate dielectric layer; forming a Silicon dioxide layer on the first in-situ doped N-type polysilicon layer; forming a second in-situ doped N-type polysilicon layer on the first dielectric layer; removing the second in-situ doped N-type polysilicon layer in an array area by selective etching using the Silicon dioxide layer as an etch stop, while maintaining the second in-situ doped N-type polysilicon layer in a peripheral area using an etch mask; depositing a barrier layer and an in-situ doped P-type polysilicon layer to replace the second in-situ doped N-type polysilicon layer in the array area; forming a floating gate in the array area from a portion of the first in-situ doped N-type polysilicon layer and a portion of the in-situ doped P-type polysilicon layer that are electrically connected through a portion of the barrier layer; and forming a peripheral transistor gate in the peripheral area from a portion of the first in-situ doped N-type polysilicon layer and a portion of the second in-situ doped N-type polysilicon layer that are electrically connected through a portion of the dielectric layer.

The dielectric layer may be a thin Silicon dioxide layer. The barrier layer may be a thin Silicon nitride layer. The in-situ doped P-type polysilicon layer may be a Boron doped layer and the barrier layer may provide a barrier to Boron diffusion.

A NAND flash memory integrated circuit may include: a plurality of peripheral transistors that do not have floating gates, a gate of a peripheral transistor including a portion of a first N-type polysilicon layer and a portion of a second N-type polysilicon layer; and a plurality of floating gates formed of portions of the first N-type polysilicon layer and portions of a P-type polysilicon layer, the P-type polysilicon layer overlying the first N-type polysilicon layer and separated from the first N-type polysilicon layer by a diffusion barrier that prevents diffusion of P-type dopant from the P-type polysilicon layer in the floating gates.

Portions of a dielectric layer may be located between the first N-type polysilicon layer and the second N-type polysilicon layer in gates of the plurality of peripheral transistors. Additional portions of the dielectric layer may be located in the floating gates, and the P-type polysilicon layer may be additionally separated from the N-type polysilicon layer by the additional portions of the dielectric layer. The dielectric layer may be a thin Silicon dioxide layer. The barrier layer may be a thin Silicon nitride layer.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

DETAILED DESCRIPTION OF EXEMPLARY EMBODIMENTS

Memory System

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

In some cases, a memory array may be formed using a double patterning process which allows features to be patterned with smaller dimensions than the minimum feature size that is achievable using direct lithographic patterning. Examples of double patterning processes are described in U.S. Pat. No. 8,194,470. Peripheral circuits are typically formed with larger dimensions formed by direct lithographic patterning.

In some memory chips, a polysilicon layer that is used to form floating gates in the memory array region is used to form part of a gate in transistors in peripheral circuits. This multipurpose polysilicon keeps the number of process steps down (as compared with depositing different layers for the array and periphery). Such a polysilicon layer may be, for example, N-type polysilicon so that floating gates, and gates of peripheral transistors, are formed of N-type polysilicon. In some cases, it is desirable to form floating gates from P-type polysilicon. However, it may not be desirable to also form gates of peripheral transistors from P-type polysilicon. Examples of processes for forming different stacks of polysilicon layers in array and peripheral areas are described in U.S. Patent Publication No. 2012/0228691.

Aspects of the present invention are directed to methods of forming floating gates at least in part from P-type polysilicon in an array area and forming gates from N-type polysilicon in a peripheral area in an efficient manner.

Figure 3A:
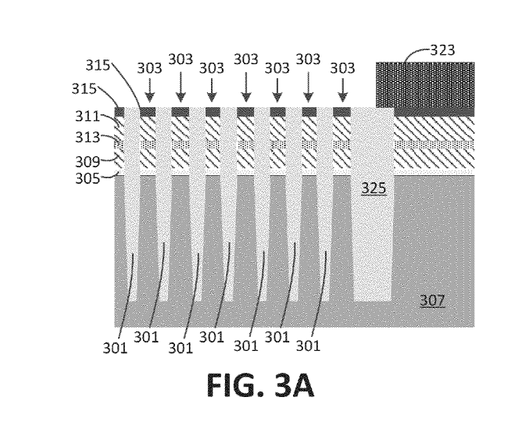
FIGS. 3A and 3B show cross sections of a NAND array area and a peripheral area respectively at an intermediate stage of fabrication.
Figure 3B:
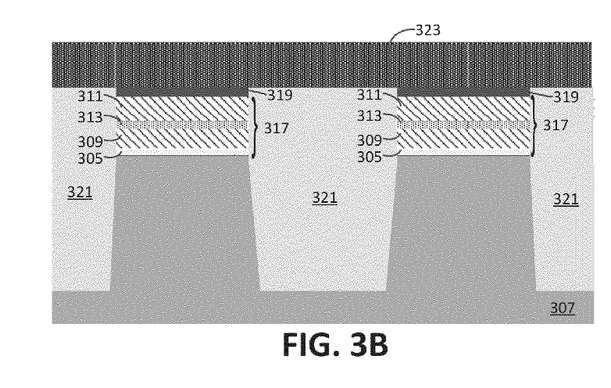

FIG. 3A shows a cross section of an array area of a NAND flash memory chip at an intermediate stage of fabrication and FIG. 3B shows a cross section of a peripheral area of the same chip at the same stage of fabrication. Processing up to the point shown may be performed by any suitable method including conventional processing techniques. Features in the array area are shown as smaller than in the peripheral area. This may be the result of double patterning or other techniques to produce extremely small features. Dimensions of features shown are representative and are not intended to be to scale.

In the array area, a series of Shallow Trench Isolation (STI) structures 301 separate individual floating gate structures 303 (structures corresponding to what become floating gates after further processing). STI structures 301 are formed by etching to form trenches which are then filled with a dielectric material, e.g. Silicon dioxide formed using Polysilazane (PSZ). A gate dielectric layer 305 separates floating gate structures from the surface of the substrate 307. Floating gate structures are formed of a lower polysilicon layer 309 and an upper polysilicon layer 311 that are separated by a dielectric layer 313. The dielectric layer 313 may be very thin so that it provides little electrical resistance and allows current flow between portions of the lower and upper polysilicon layers. The dielectric layer 313 may be formed of Silicon dioxide. The dielectric layer 313 may be formed by an Oxygen purge after formation of the lower polysilicon layer 309 and prior to formation of the upper polysilicon layer 311. Both lower and upper polysilicon layers are formed of in-situ doped N-type polysilicon with an appropriate doping level (e.g. N+). The formation of these layers may be identical or may be different (e.g. different thicknesses, and/or different doping levels etc.). Portions of hard mask material 315 remain over floating gate structures where the portions of hard mask material were used for patterning to form STI trenches 301. Hard mask material may be Silicon nitride or other suitable material.

In the peripheral region of FIG. 3B, gate structures 317 are present where gates of peripheral transistors are to be formed. Gate structures 317 are formed of the same lower polysilicon layer 309 and upper polysilicon layer 311 with a thin dielectric layer 313 between them. Hard mask portions 319 remain in the peripheral region where they were used for patterning during formation of STI trenches 321. (STI trenches in the periphery may be larger, both in width and depth, than STI trenches in the memory array area and may be filled with different material, e.g. Non-doped Silicate Glass, or "NSG") It will be understood that processing up to this point may be largely the same in both the array area and the peripheral area so that the process is efficient in terms of the number of steps used.

A photoresist layer 323 overlies the peripheral area and is shown extending up to the edge of the array area (it ends over an STI trench 325 that separates the array area from the peripheral area). The photoresist layer 323 allows separate processing of the array area in subsequent steps so that floating gate structures in the array area may be modified to be different from gate structures in the peripheral area.

Figure 4A:
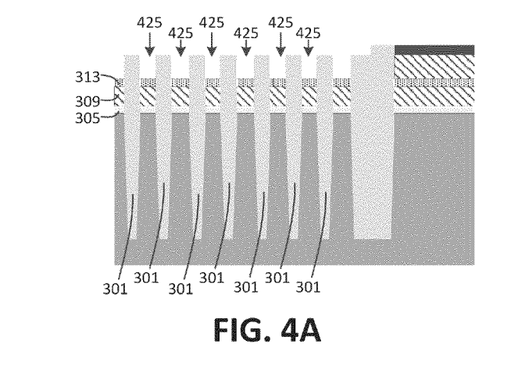
FIGS. 4A and 4B show cross sections corresponding to FIGS. 3A and 3B after removal of upper polysilicon in the array area only.
Figure 4B:
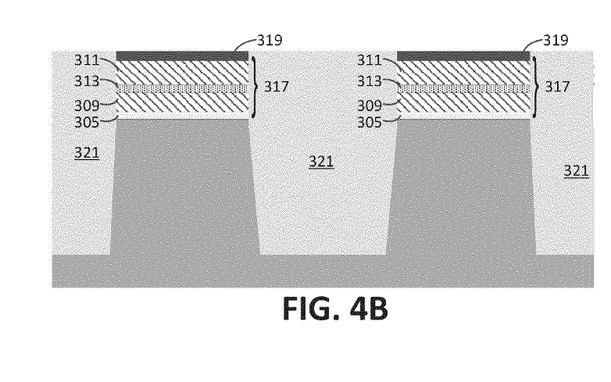

FIGS. 4A and 4B show the array area and peripheral area respectively after further processing in the array area. In particular, FIG. 4A shows that the upper polysilicon layer 311 has been removed in the array area by a selective etch that maintains the STI structures 301. A selective etch, such as Trimethyl(2-hydroxyethyl)ammonium hydroxide ([CH3)3N (CH2CH2OH)]+OH—), or "TMY," may be used to remove upper polysilicon material 311 without removing material of the dielectric layer 313. The hard mask portions 315 are removed from the array area prior the selective etch, for example by Reactive Ion Etching (RIE) and ashing of Silicon nitride. The photoresist is removed after the selective etch.

Figure 5:
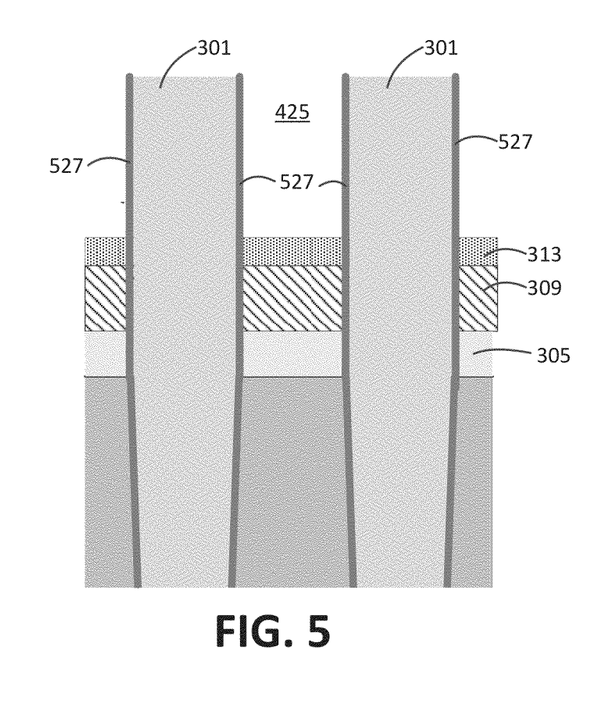
FIG. 5 shows a detailed view of the structure of FIG. 4A.

FIG. 5 shows a more detailed view of a portion of the array area of FIG. 4A. In particular, FIG. 5 shows portions of lower polysilicon layer 309 with overlying portions of the dielectric material 313. The dielectric layer 313 may act as an etch stop layer when removing the upper polysilicon layer so that the etch depth can be accurately controlled and may be uniform across a substrate. Sides of STI structures 301 are shown having a liner oxide layer 527 (a layer of Silicon dioxide formed in STI trenches prior to filling. STI structures 301 are formed using Polysilazane (PSZ) to fill STI trenches with Silicon dioxide in this example. In the present example, the material of dielectric layer 313 is Silicon dioxide. In other examples, other dielectric materials such as Silicon nitride may also be used as the dielectric material. The dielectric layer 313 that is used as an etch stop may be removed, or may be left in place at this stage, depending on and requirements. An oxide etch may remove a Silicon dioxide dielectric layer and liner oxide so that the lower polysilicon layer 301 is exposed. Alternatively, dielectric layer 313 may be left in place as shown in FIG. 5.

Figure 6:
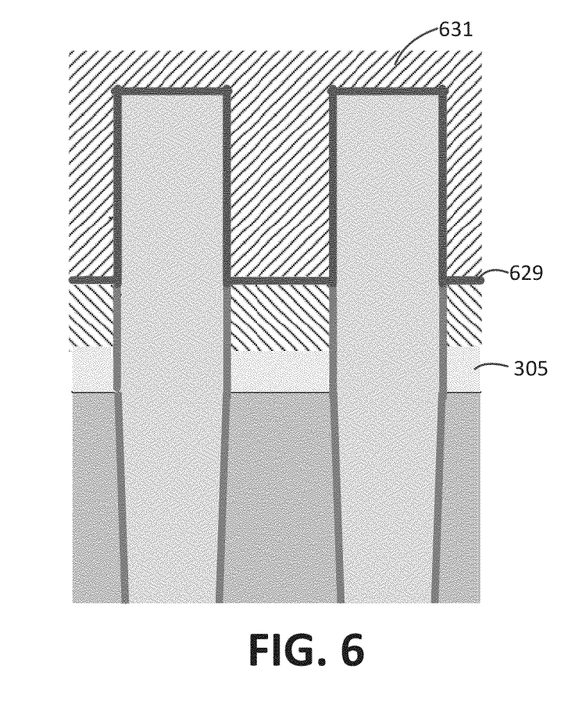
FIG. 6 shows the structure of FIG. 5 after deposition of a barrier layer and an in-situ Boron-doped polysilicon layer.

FIG. 6 shows the structure of FIGS. 5 (and 4A) after subsequent deposition of a barrier layer 629 and third polysilicon layer 631. In this example, the barrier layer 629 is a dielectric layer that is formed of Silicon nitride and the third polysilicon layer 631 is a P-type polysilicon layer. In particular, the third polysilicon layer 631 is an in-situ Boron-doped polysilicon layer with an appropriate level of doping (e.g. P+). In general, Boron tends to diffuse easily and Silicon nitride provides a barrier to such diffusion and so maintains Boron in the third polysilicon layer 631 and prevents Boron from diffusing into surrounding structures where it could impact the device.

Figure 7A:
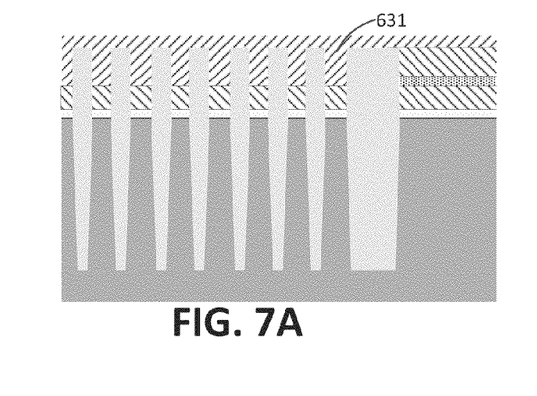
FIGS. 7A and 7B show cross sections corresponding to FIGS. 4A and 4B after deposition of a barrier layer and an in-situ Boron doped polysilicon layer.
Figure 7B:
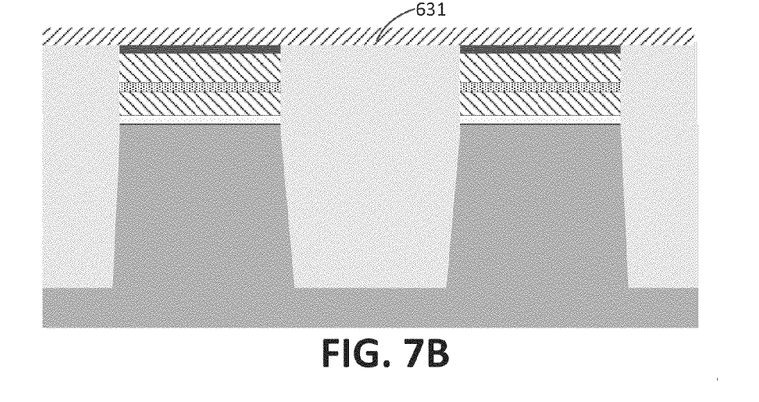

FIG. 7A shows a larger view of the structure of FIG. 5 and FIG. 7B shows the peripheral area at this stage (the barrier layer 629 is not visible in this view but it will be understood that the barrier layer underlies third polysilicon layer 631). The third polysilicon layer 631 and the barrier layer overlie both the array area and the peripheral area. It will be understood that the third polysilicon layer 631 may be very thin (e.g. 10 nanometers) because the openings that it has to fill (e.g. openings 425 of FIG. 5) in the array area may be extremely small (e.g. less than 20 nm wide).

Figure 8A:
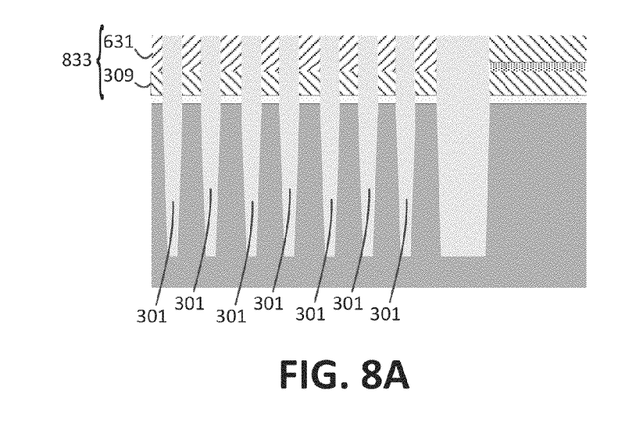
FIGS. 8A and 8B show cross sections corresponding to FIGS. 7A and 7B after etching back to remove excess material.
Figure 8B:
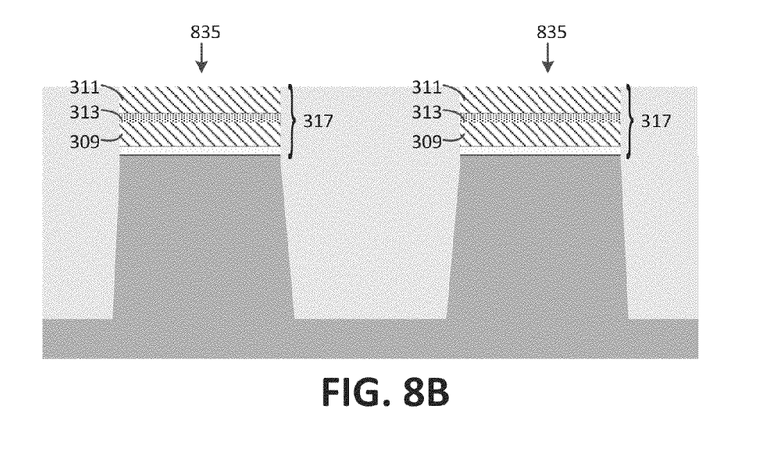

FIGS. 8A and 8B show the array and peripheral areas respectively after subsequent processing. The third polysilicon layer 631 may be removed from the periphery, and from over STI structures 301. This may be achieved using an etch back process (e.g. a blanket 25 nanometer etch back). This leaves the third polysilicon material 631 only between STI structures 301. Hard mask layers are also removed from the peripheral areas by etch back or otherwise (e.g. CMP).

It can be seen that floating gates 833 formed according to the above example may include portions of a lower N-type polysilicon layer 309 with portions of a P-type polysilicon layer 631 on top (separated by a barrier layer 629). The thickness of the barrier layer 629 may be sufficiently small so that it provides little electrical resistance and a floating gate may be considered a single electrically continuous body. Although part of a floating gate 833 is N-type material, the floating gate may show significant improvement in charge storage characteristics as compared with a floating gate that is formed of only N-type material. In the peripheral transistors 835, gate structures 317 are formed of N-type polysilicon only (polysilicon layer 309 and polysilicon layer 311) and thus peripheral transistors may thus have characteristics that are unaffected by P-doped polysilicon in the memory array area. This may allow use of P-type material in the memory array without redesign of peripheral circuits.

Figure 9:
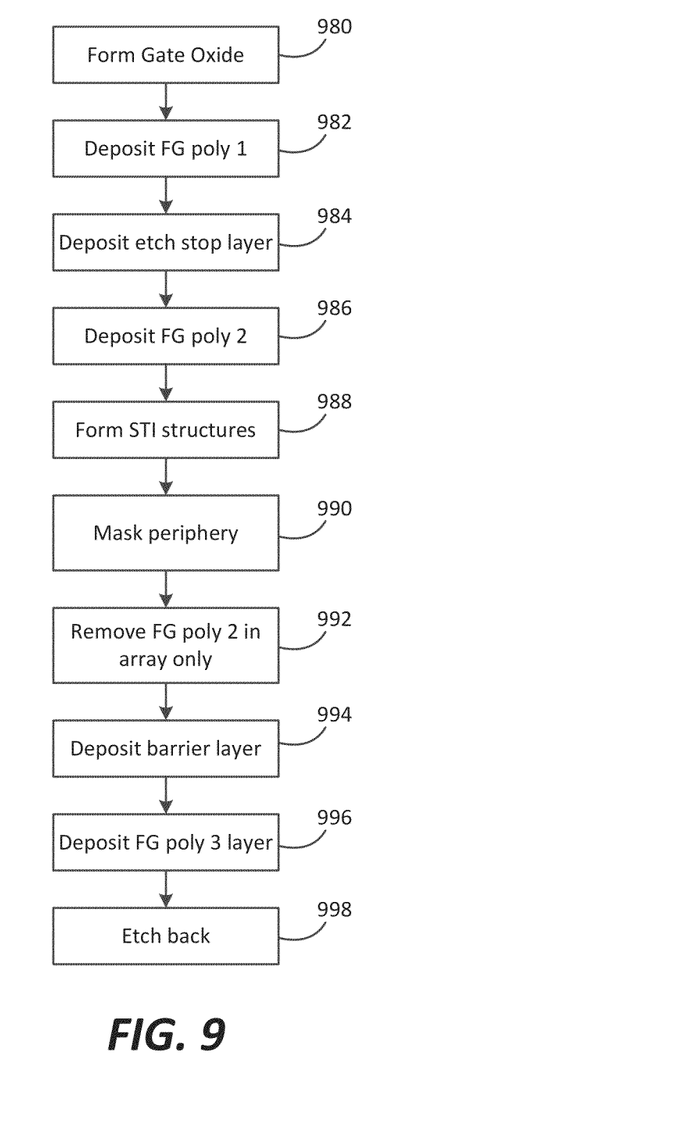
FIG. 9 is a flowchart illustrating an example of process steps used in forming NAND flash memory chips.

FIG. 9 shows a flowchart for an example of a process of making a NAND flash memory chip. It will be understood that additional steps that are not shown are also performed in making a NAND flash memory chip. Conventional steps are largely omitted for clarity.

A gate dielectric, such as a gate oxide, is formed on a substrate surface 980. Then, a first floating gate polysilicon (FG poly 1) layer is deposited 982 on the gate dielectric layer. The FG poly 1 may be an in-situ doped N-type polysilicon. An etch stop layer is deposited on the FG poly 1 layer 984. The etch stop layer may be a dielectric layer that is thin enough to provide little resistance from one side to the other. Then, a second FG poly (FG poly 2) is deposited over the etch stop layer 986. FG poly 2 may be another N-type in-situ doped polysilicon layer. STI structures are then formed in both the array and the periphery 988, e.g. by patterning, etching trenches, lining trenches, and filling trenches using PSZ Silicon dioxide or NSG. The periphery is then masked 990 to maintain the FG poly 1 and FG poly 2 in the peripheral area while carrying out further processing in the peripheral area. FG poly 2 is removed in the array area only 992 to leave openings. Then a barrier layer is deposited 994 and a third floating gate polysilicon layer (FG poly 3) is deposited 996. FG poly 3 may be of a different type to FG poly 1 and 2. In this example, FG poly 3 is a P-type polysilicon formed as in-situ Boron doped polysilicon. Thus, FG poly 2 is used as a sacrificial layer in the array where it is replaced with FG poly 3, while FG poly 2 is maintained in the periphery to form a gate that is all N-type poly. An etch back is subsequently performed 998 to remove excess FG poly 3 (e.g. over peripheral area and over the field in the memory array area) leaving FG poly 3 in floating gate structures.

It will be understood that additional process steps are performed subsequent to the steps described including formation of a dielectric over the floating gates and the formation of control gates etc. These steps may be performed in any suitable manner.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

The invention claimed is:

1. A method of forming a NAND flash memory integrated circuit comprising:
   forming a first polysilicon layer overlying a gate dielectric layer;
   forming a first dielectric layer overlying the first polysilicon layer;
   forming a second polysilicon layer overlying the first dielectric layer;
   removing the second polysilicon layer in an array area using the first dielectric layer as an etch stop, while maintaining the second polysilicon layer in a peripheral area;
   depositing a second dielectric layer and a third polysilicon layer to replace the second polysilicon layer in the array area;
   forming a floating gate in the array area from a portion of the first polysilicon layer and a portion of the third polysilicon layer connected through a portion of the second dielectric layer; and
   forming a transistor gate in the peripheral area from a portion of the first polysilicon layer and a portion of the second polysilicon layer connected through a portion of the first dielectric layer.

2. The method of claim 1 wherein the first polysilicon layer and the second polysilicon layer are of a first type and the third polysilicon layer is of a second type.

3. The method of claim 2 wherein the first type is N-type and the second type is P-type.

4. The method of claim 3 wherein the third polysilicon layer is in-situ doped with Boron and the second dielectric layer forms a barrier to Boron diffusion.

5. The method of claim 4 wherein the second dielectric layer is formed of Silicon Nitride.

6. The method of claim 1 wherein the first dielectric layer is removed along with the second polysilicon layer in the array area prior to depositing the second dielectric layer and the third polysilicon layer.

7. The method of claim 1 wherein the first dielectric layer is maintained in the array area when the second polysilicon layer is removed, and the second dielectric layer is deposited directly on the first dielectric layer in the array area.

8. The method of claim 1 wherein the first dielectric layer is Silicon dioxide.

9. The method of claim 8 wherein the first dielectric layer has a thickness that is sufficiently small that the first polysilicon layer and the second polysilicon layer are substantially electrically connected.

10. A method of forming a NAND flash memory integrated circuit comprising:
    forming a gate dielectric layer on a surface of a substrate;
    forming a first in-situ doped N-type polysilicon layer on the gate dielectric layer;
    forming a Silicon dioxide layer on the first in-situ doped N-type polysilicon layer;
    forming a second in-situ doped N-type polysilicon layer on the first dielectric layer;
    removing the second in-situ doped N-type polysilicon layer in an array area by selective etching using the Silicon dioxide layer as an etch stop, while maintaining the second in-situ doped N-type polysilicon layer in a peripheral area using an etch mask;
    depositing a barrier layer and an in-situ doped P-type polysilicon layer to replace the second in-situ doped N-type polysilicon layer in the array area;
    forming a floating gate in the array area from a portion of the first in-situ doped N-type polysilicon layer and a portion of the in-situ doped P-type polysilicon layer that are electrically connected through a portion of the barrier layer; and
    forming a peripheral transistor gate in the peripheral area from a portion of the first in-situ doped N-type polysilicon layer and a portion of the second in-situ doped N-type polysilicon layer that are electrically connected through a portion of the dielectric layer.

11. The method of claim 10 wherein the dielectric layer is a thin Silicon dioxide layer.

12. The method of claim 10 wherein the barrier layer is a thin Silicon nitride layer.

13. The method of claim 10 wherein the in-situ doped P-type polysilicon layer is a Boron doped layer and the barrier layer provides a barrier to Boron diffusion.

* * * * *